(12) United States Patent
Liljedahl et al.

(10) Patent No.: US 7,482,624 B2
(45) Date of Patent: Jan. 27, 2009

(54) ORGANIC ELECTRONIC CIRCUIT AND METHOD FOR MAKING THE SAME

(75) Inventors: Rickard Liljedahl, Linköping (SE); Mats Sandberg, Rimforsa (SE); Göran Gustafsson, Linköping (SE); Hans G. Gudesen, Brussels (BE)

(73) Assignee: Thin Film Electronics Asa, Oslo (NO)

( * ) Notice: Subject to any disclaimer, the term of this patent is extended or adjusted under 35 U.S.C. 154(b) by 296 days.

(21) Appl. No.: 11/185,861

(22) Filed: Jul. 21, 2005

(65) Prior Publication Data
US 2006/0046344 A1 Mar. 2, 2006

(30) Foreign Application Priority Data
Jul. 22, 2004 (NO) .................... 20043163

(51) Int. Cl.
*H01L 35/24* (2006.01)
(52) U.S. Cl. .................... 257/40; 257/295; 257/759; 257/E51.003; 257/E51.008; 257/E51.027
(58) Field of Classification Search .......... 257/40, 257/295, 759, E51.003, E51.008, E51.025, 257/E51.027, E23.162, 51.162
See application file for complete search history.

(56) References Cited

U.S. PATENT DOCUMENTS 5,158,829 A * 10/1992 Wegmann et al. ........ 428/411.1

(Continued)

FOREIGN PATENT DOCUMENTS

DE 2935055 A1 3/1981

(Continued)

OTHER PUBLICATIONS

Xu et al., Journal of Applied Polymer Science, vol. 88, 2003, pp. 1416-1419.

(Continued)

*Primary Examiner*—Matthew E Warren
(74) *Attorney, Agent, or Firm*—Birch, Stewart, Kolasch & Birch, LLP

(57) ABSTRACT

In an organic electronic circuit, particularly a memory circuit with an organic ferroelectric or electret material the active material comprises fluorine atoms and consists of various organic materials. The active material is located between a first electrode and a second electrode. A cell with a capacitor-like structure is defined in the active material and can be accessed for an addressing operation via the first and the second electrode. At least one of these electrodes comprises a layer of chemically modified gold. In a passive matrix-addressable electronic device, particularly a ferroelectric or electret memory device, circuits of this kind with the active material as a ferroelectric or electret memory material form the elements of a matrix-addressable array and define the memory cells provided between first and second set of addressing electrodes. At least the electrodes of at least one of the sets then comprise at least a layer of gold. A method in the fabrication of the organic electronic circuit the method comprises steps for depositing a layer of gold as at least one layer of at least one electrode and treating an exposed surface on this layer chemically, whereafter the layer of active material can be deposited on the top of the processed surface of this electrode.

10 Claims, 8 Drawing Sheets

U.S. PATENT DOCUMENTS

Figure 1:
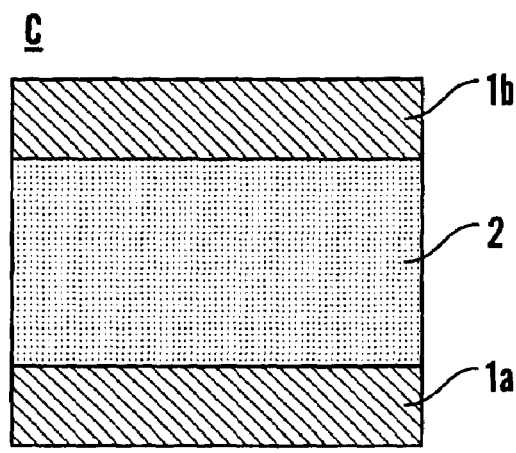

| | | |
|---|---|---|
| 6,878,980 B2 | 4/2005 | Gudesen et al. |
| 2005/0006643 A1* | 1/2005 | Lan et al. .................. 257/40 |
| 2005/0242343 A1 | 11/2005 | Edvardsson et al. |
| 2005/0249975 A1 | 11/2005 | Sandberg et al. |

FOREIGN PATENT DOCUMENTS

| | | |
|---|---|---|
| JP | 49123132 | 11/1974 |
| WO | WO-99/08325 A2 | 2/1999 |
| WO | WO-99/12170 A3 | 3/1999 |
| WO | WO-03/041084 A1 | 5/2003 |
| WO | WO-03/043013 A1 | 5/2003 |
| WO | WO-03/044801 A1 | 5/2003 |
| WO | WO-03/046995 A1 | 6/2003 |

OTHER PUBLICATIONS

Bloβ et al., Rev. Sci. Instrum., vol. 65 No. 5., May 1994, pp. 1541-1550.

Feller et al, Appl. Phys. Lett., vol. 79, No. 6, Aug. 2001, pp. 779-781.

Das-Gupta et al., J. Phys. D: Appl. Phys., vol. 23, 1990, pp. 1485-1490.

* cited by examiner

ORGANIC ELECTRONIC CIRCUIT AND METHOD FOR MAKING THE SAME

The present invention concerns an organic electronic circuit, particularly a memory circuit, with an organic ferroelectric or electret active material, wherein the active material comprises fluorine atoms and consists of single molecules, oligomers, homopolymers, copolymers, or blends or compounds thereof, wherein the active material is in contact with a first electrode and a second electrode, whereby a cell with a capacitor-like structure is defined in the organic active material and can be accessed electrically directly or indirectly via the electrodes.

The present invention also concerns a method in the fabrication of an organic electronic circuit, or a passive matrix-addressable array of such circuits, wherein the circuits particularly are memory circuits, wherein a memory circuit comprises an organic ferroelectric or electret active material, wherein the active material comprises fluorine atoms and consists of single molecules, oligomers, homopolymers, copolymers, or blends or compounds thereof in contact with a first electrode of the circuit, and a second electrode of the circuit, whereby a cell of active material with a capacitor-like structure is defined in the organic active material and can be accessed electrically directly or indirectly via the electrodes.

During recent years, non-volatile data storage devices have been demonstrated where each bit of information is stored as a polarization state in a localized volume element of an electrically polarizable material. A material of this kind is called an electret or ferroelectric material. Formally ferroelectric materials are a subclass of electret materials and capable of being spontaneously polarized to either a positive or negative permanent polarization state. By applying an electric field of appropriate polarity, it is moreover possible to induce a switching between the polarization states. Non-volatility is achieved since the material can retain its polarization even in the absence of externally imposed electrical fields.

Related to ferroelectric and electret materials there are, however, some phenomena that have detrimental influenceon the performance of circuits and devices that employ these materials as their active materials, i.e. materials that undergo a change in a physical or chemical state or switch between states when subjected to an electric field or voltage.

Ferroelectric materials, which are subjected to electrical field stresses of repeated nature, e.g. numerous polarization switches, suffer fatigue, i.e. deterioration of the electrical response required for reliable operation of the device employing the ferroelectric material. In a ferroelectric memory cell this manifests itself as a decrease of polarization, causing less charge to be released that may be used in detection of the polarization state of the cell. Consequently fatigue will ultimately render the device useless. There will be a number of switching that a device can sustain until fatigue becomes critical.

Another problem is disturb, which is related to loss of polarization in a ferroelectric or electret memory cell which has been prepared in a given polarization state and then is exposed to disturbing voltage pulses with a polarity in the opposite direction (i.e. a direction tending to polarize the cell in a sense opposite to that where it had been prepared). Even when the disturbing voltages are well below what is required to completely switch the polarization state, repeated exposure may cause the material to undergo partial switching leading to a loss of polarization.

Ferroelectric materials that are allowed to remain in a polarization state for a period of time are subjected to imprint. It manifests itself as a change in the switching properties whereby there is a decrease in the electrical field perceived by the material when an opposite-polarity electrical field is applied to switch the polarization direction into the opposite from where the material has resided during the imprinting period. In other words, the polarization has a tendency to become stuck in the direction where it is allowed to rest for some time.

Generally, one can say that these problems are related to performance deterioration in circuits and devices that utilize and take advantage of ferroelectric and electret materials. The deterioration of performance pertains to the degree of polarization and the possibility to alter and detect the polarization in a desirable manner.

As described in patent applications previously filed by the present applicant, e.g. International published application WO99/12170, organics-based and in particular polymeric ferroelectric active materials provide considerable advantages for use in memory and/or processing devices as compared to their inorganic counterparts. However, the problems mentioned above also do occur in organic-based ferroelectric or electret materials and which if not solved will cause obstacles for commercialization. Some of the most promising materials are based on vinylidene fluoride (VDF), for example polyvinylidene fluoride(PVDF) and the copolymer poly(vinylidene fluoride-trifluoroethylene) P(VDF-TrFE).

Typically a memory device with memory cells using ferroelectric or electret materials as memory material has a capacitor-like structure with a layer of the memory material stacked between two layers of electrodes. It has previously been shown that performance of ferroelectric memory cells may be improved by introducing so called functional materials in the interface between an electrode and the memory material of the cells. The name "functional" emphasize that a functional interlayer shall have a range of functions. Not only shall the functional interlayer prevent deleterious chemical reactions between the electrodes and the memory material, another function of the interlayer may for instance be to provide protection towards physical damage that can occurduring manufacturing, for example during metal deposition of the electrodes. Another example of a function of the interlayer is to provide efficient electrical coupling between electrode and memory material.

In International published application WO03/044801 filed by the present applicant, functional materials that may be incorporated in the electrode material, are disclosed or provided as a separate interlayer between the electrode and the memory material. Groups of conducting functional materials are presented, viz. such that are conducting and capable of physical and/or bulk incorporation of atomic or molecular species contained in either the electrode material or the memory material. While the exchange of for instance ionic species between the electrodes and the memory material, not only may be detrimental for both, but in addition also may increase the effect of the fatigue, the use of a functional interlayer capable of the above-mentioned incorporation shall serve to retain the functionalities of the electrodes and the memory material and largely eliminate fatigue.

Circuits with interlayers in the prior art improve performance for relevant memory circuits compared to known memory circuits without interlayers. It is though desirable to achieve similar improvements without interlayers. For example will there be benefits if a memory circuit structure can be kept as simple as possible and if manufacturing steps can be reduced or simplified. An interlayer typically increases complexity, both in circuits and in manufacturing.

There is a general need to improve the performance of organic ferroelectric or electret memory circuits. In particular this is desired for circuits that are close to reaching commercialization, viz. circuits and memory cells with organic ferroelectric or electret materials that consist of single molecules, oligomers, homopolymers, copolymers, or blends or compounds thereof and that are based on vinylidene fluoride (VDF), for example polyvinylidene fluoride (PVDF),and poly(vinylidene fluoride-trifluoroethylene) [P(VDF-TrFE)]. At the same time it is desirable to keep complexity down in such circuits and in the manufacturing of the same.

In organic electronic circuits based on an organic ferroelectric or electret active, i.e. switchable material as for instance used in memory circuits, the electrode materials have turned out to be a matter of concern, particularly used in conjunction with the fluorine-based materials as mentioned above. Although these materials have desirable properties as memory materials, it has turned out that detrimental reactions and processes that impair both the electrode as well as the memory material function may occur.

Due to their chemical inertness and stability noble metals such as for example gold and platinum should be obvious candidate materials for use as conductors and electrodes in integrated circuits. They have however, found a limited use compared to e.g. usual materials such as aluminium, copper and titanium. To protect against corrosion and chemical attack gold has, however, been widely employed for plating and coating contacts and the like. One reason that noble metals, and in particular gold, has drawn little prior attention in the field of the present invention is due to diffusion-related problems and contamination that may follow and which must be avoided in most fabrication environments. There are, however, existing environments that are adapted to handle these problems. On basis of the fact that noble metals qualify commercially, but that these materials previously have not been considered for use as electrodes in circuits relevant for the present invention, and due to the fact that noble metals are substantially inert materials, the inventors have undertaken extensive experiments and investigations with the aim of introducing noble metals as electrode material in memory circuits as mentioned above. Particularly there has been found that it is possible to achieve memory circuits that perform superior compared to many of the alternatives, including proposed solutions with interlayers. Since a high degree of inertness is a desired property and since that stable conditions and behaviour for a memory circuit are desired for a relatively long period of time in normal environment, noble metals that have an oxidation potential lower than silver are of particular interest, which includes gold, platinum, palladium etc. Based on the inventors' investigations, it was found that gold at present appears to be by far the best candidate as electrode material for the organic electronic circuit according to the invention. To sum up, it has been conclusively shown that among noble metal candidates for an electrode material, gold has the best properties and hence the present invention is limited to the use of gold as an electrode material.

However, in addition to the cell structure and material, a pre-requisite for improved performance in a manufactured memory circuit is that special care has been taken in the manufacturing process to avoid and/or remove any contaminations on the electrode surfaces. In the scope of the present invention this is explained by that any contaminating species between the gold electrode and the memory material will cause reactions in the interface, resulting in degradation of ferroelectric properties, or even delamination of memory circuit layers. For example, in produced samples of a gold electrode memory cell, a deficient manufacturing process causes detrimental reactions of the mentioned type which may lead to partial delamination and the formation of "bubbles" during and after operation of the memory cell. Without knowledge of the importance to avoid even the smallest interface reactions and without precautions taken accordingly, gold and noble metals are not an evident choice and will not always result in good performance when used as electrodes in a practical memory circuit of the relevant type, i.e. where the organic memory material typically is based on VDF, such as in PVDF and copolymer P(VDF-TrFE).

It is hence a major object of the present invention to provide an electrode structure based on gold for use in circuits with a ferroelectric or electret active material, such that a proper circuit function of such circuits is maintained over a large number of operational cycles.

Further it is also an object of the present invention to provide a method for manufacturing gold-based electrode structures as being disclosed in the present invention.

Finally, it is also an object of the present invention to ensure that the compatibility of a manufacturing method for electrode structures based on gold with a general and common method in the fabrication of circuits, particularly memory circuits based on ferroelectric or electret active material.

The above objects as well as further advantages and features are realized with an organic electronic circuit according to the present invention and characterized in that at least one of the electrodes comprises at least one layer of gold chemically modified by iodine, the iodine being at least provided in or at a gold layer surface interfacing the organic active material.

In an advantageous embodiment of the present invention the organic electronic circuit forms a layer in a stack of n such circuits $C_1 \ldots C_n$ such that the bottom electrodes $1a$ of circuit $C_k$ forms the top electrode of a preceding circuit, $C_{k-1}$, where $2 \leq k \leq n$.

In another advantageous embodiment of the present invention the organic electronic circuit forms an element or a cell in a passive matrix-addressable array of a plurality of such circuits, that the matrix-addressable array particularly is a ferroelectric or electret memory device comprising organic memory cells, that the memory cells are provided as distinct portions in a global thin-film layer of an organic ferroelectric or electret active material, that first and second electrode means are provided as respective sets of parallel strip-like electrodes that the electrodes of the second electrode means are oriented crossing at an angle to the electrodes of the first electrode means, that the organic global thin-film layer of active material is sandwiched between the electrode means, that the memory cells of the memory circuits are defined in the thin-film layer at the crossings or respectively the electrodes of the first electrode means and the electrodes of the second electrode means, and that an array of memory circuits is formed by the electrode means and the global layer of active material, whereby the addressing of the memory cells for write and read operations thereto can take place via the electrodes suitably connected with external circuitry for driving, control and detection.

The above objects as well as further advantages and features are also realized with a method according to the present invention which is characterized by comprising steps for depositing a layer of gold as at least one layer on at least the first electrode; modifying chemically an exposed surface of the at least one layer of gold by treating it with a substance comprising iodine or iodine atoms; and depositing a layer of active material on top of the chemically modified surface of at least the first electrode.

Figure 2:
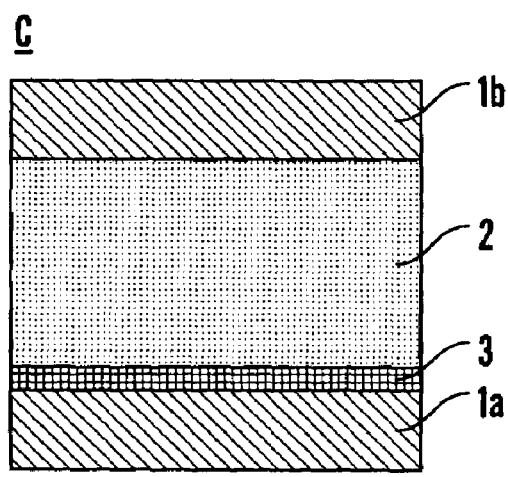
Figure 3:
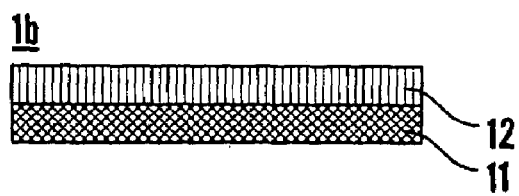
Figure 4A:
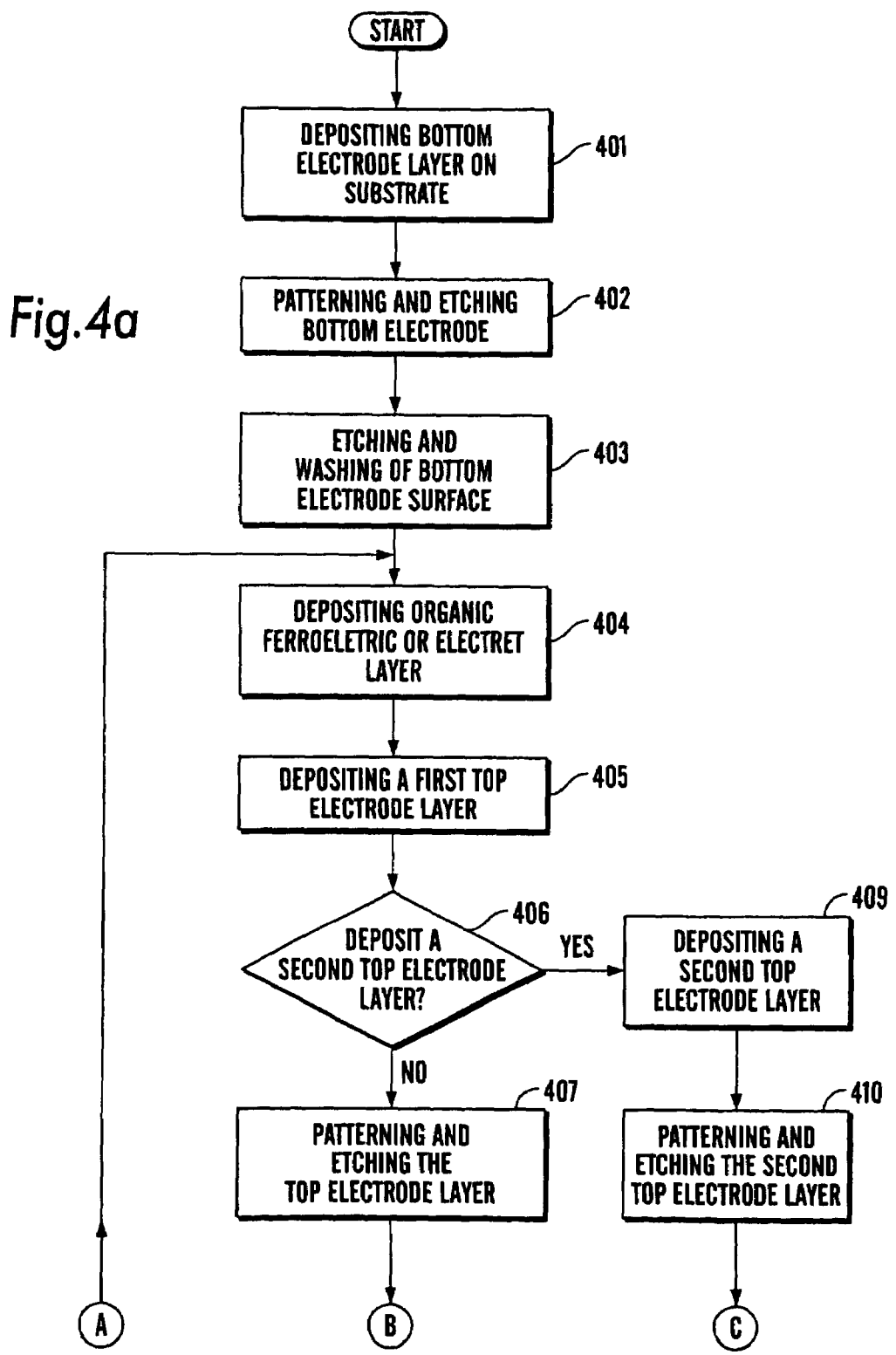
Figure 4B:
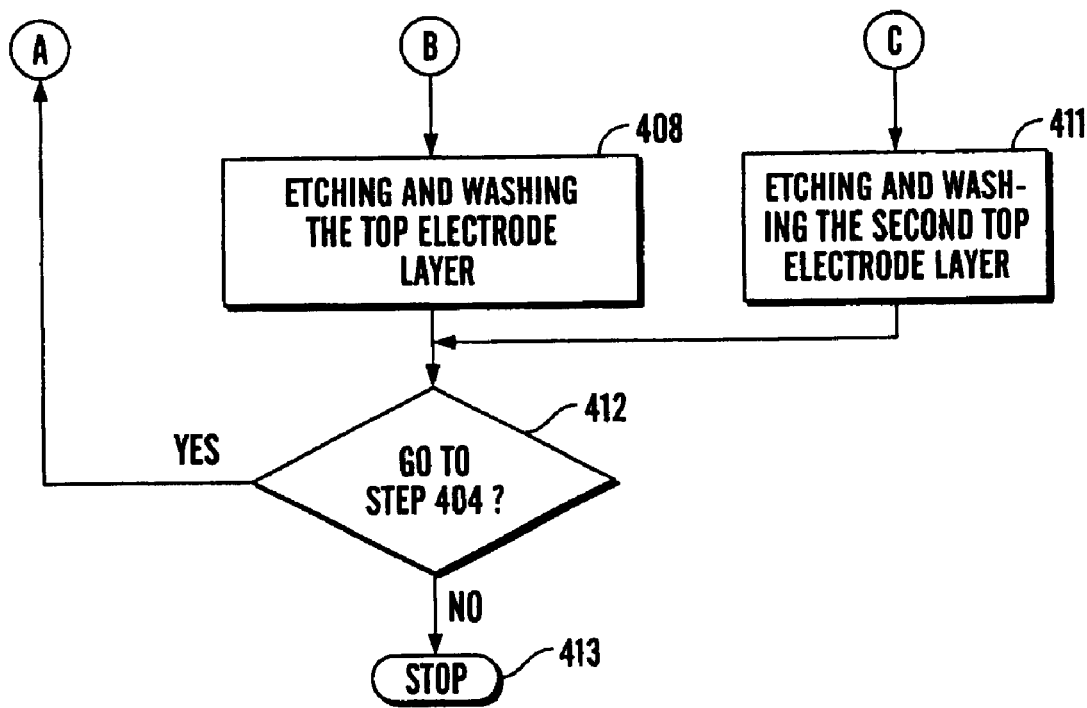
Figure 5:
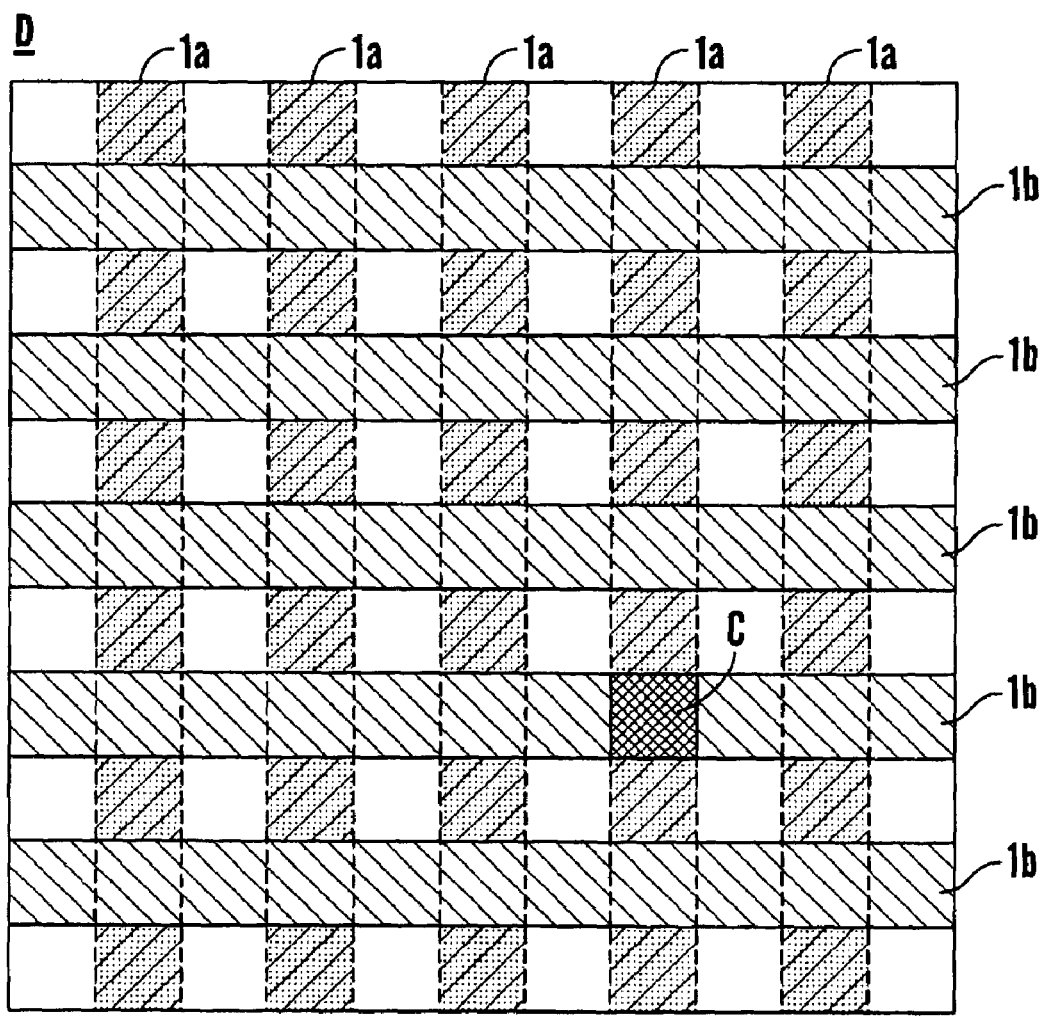
Figure 6A:
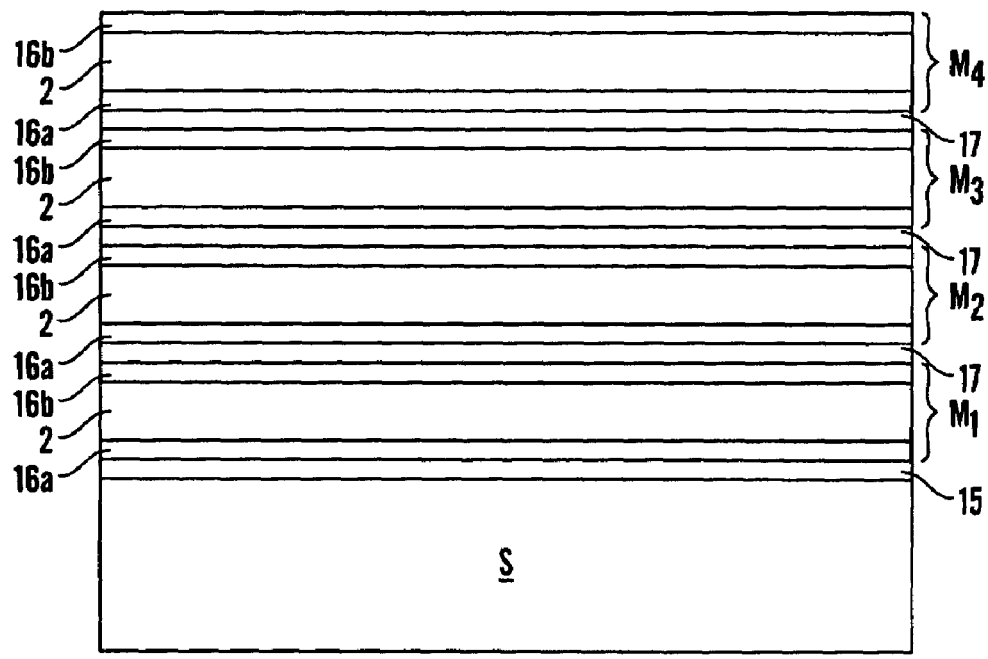
Figure 6B:
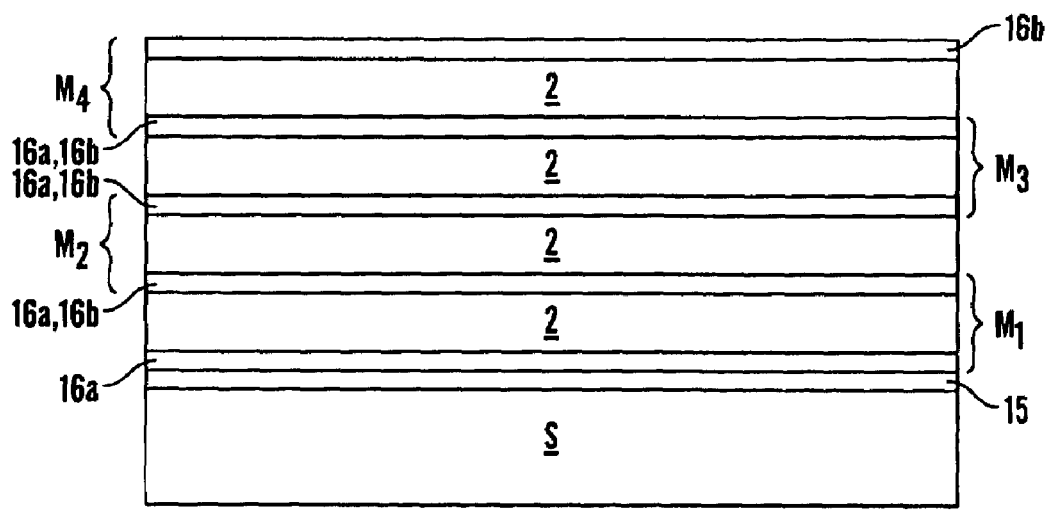
Figure 7A:
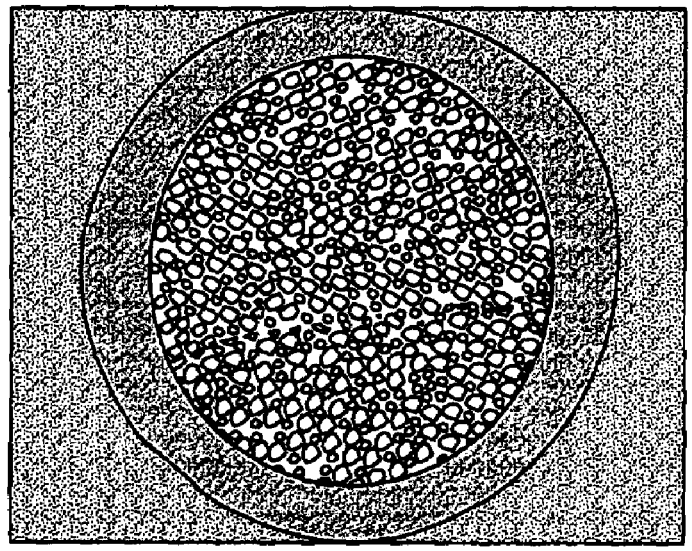
Figure 7B:
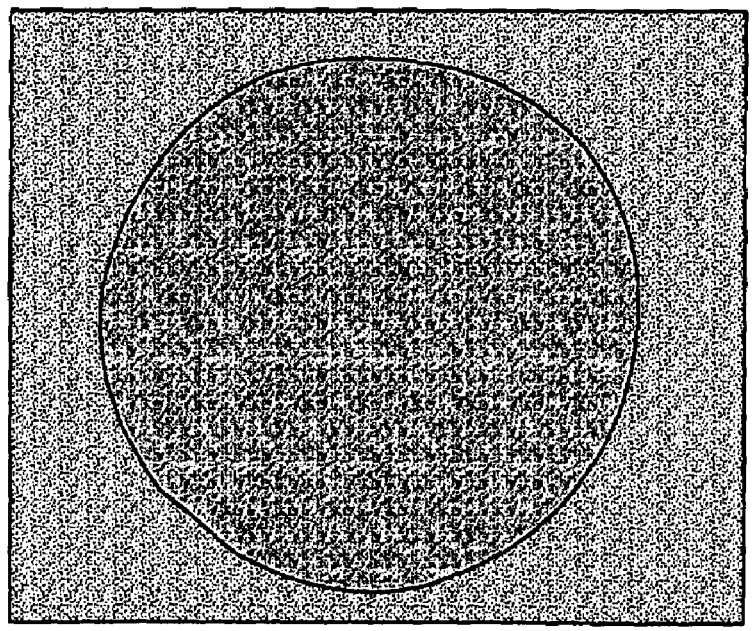

Further features and advantages shall be apparent from the appended dependent claims The invention shall now be described in more detail, with reference to exemplary embodiments and in conjunction with the appended drawing figures, of which FIG. 1 shows a circuit, particularly a memory circuit, according to an embodiment of the present invention, but with a structural disposition known in the prior art, FIG. 2 shows a circuit, particularly a memory circuit, according to another embodiment of the present invention, FIG. 3 shows a double-layered top electrode with a layer of gold and which can be employed provided as a top electrode in any of the embodiments shown in FIG. 1 or FIG. 2, FIGS. 4a and 4b show a flow chart of steps in the method according to the present invention, FIG. 5 shows a plan view of a matrix-addressable electronic device comprising an array of circuits according to the present invention, FIG. 6a shows a cross section of a first embodiment of a device comprising a stack of matrix-addressable electronic devices like the one in FIG. 5, FIG. 6b shows a cross section of another embodiment of a device comprising a stack of the matrix-addressable devices like the one in FIG. 5, FIG. 7a shows a micro photography of a gold electrode as manufactured and used in the prior art, FIG. 7b shows a micro photography of a gold electrode according to the present invention, and FIGS. 8a-d show respectively fatigue curves and the pulse response for a circuit as known in the art, and fatigue curves and the pulse response for the circuit according to the present invention.

The general background of the present invention shall now be briefly discussed. The inventors have found that a substantial factor in the deterioration of ferroelectric properties for memory circuits relevant for the present invention is reactions in the interface between electrode and memory material or between an interlayer and the memory material. Even reactions of small extent may result in and is a reason for observed deteriorated performance. This makes it hard to accomplish any high performance electronic device based on such circuits. Reactions are particularly hard to avoid when the organic electret or ferroelectric memory material contains fluorine, which is the case for some of the most promising organic ferroelectrics of today, viz. VDF-based materials such as for example PVDF(polyvinylidene fluoride) and P(VDF-TrFE) [poly(vinylidene fluoride-trifluoroethylene)], likely due to the chemical aggressiveness of fluorine. In order to reduce detrimental reactions, focus has recently been on finding and introducing inert interlayer materials between electrode and memory material. Since these materials typically, besides being inert, shall possess other functions, interlayers of these materials typically are referred to as functional interlayers. Solutions based on such interlayers are for example presented in the present applicants pending Norwegian patent applications Nos. 20041276 and 20041733. A drawback with an interlayer structure is the resulting increased complexity, for example will an interlayer typically require additional steps in the manufacturing and involve additional materials. Two new interface regions also occur when an interlayer is introduced. It would clearly be beneficial if a layer of a single electrode material could be used together with a layer of the memory material. However, there is a limited amount of electrode materials that may be used, especially when metal electrodes are desired which often is required if the circuit shall connect and/or be integrated with standard silicon based electronics. This is for example the case in integrated hybridcircuits that involve both traditional technologies such as CMOS and organic memory cells, typically sharing a common substrate, e.g. $SiO_2$. The most commonly used electrode metals are aluminium, titanium, copper etc. However, when these materials are in direct contact with a ferroelectric material containing fluorine, as for example VDF-based ferroelectric materials, the result is inferior performance compared to cases making use of functional interlayers which separate the electrode from the memory material.

FIG. 1 shows a first embodiment of a memory circuit C with gold electrodes 1a and 1b interfacing the memory material 2 in a configuration corresponding to a parallel-plate capacitor. It is structurally similar to prior art capacitive memory circuits, as for instance used in DRAM circuits and ferroelectric memories generally. The memory material of the circuit is an organic ferroelectric or electret material, here P(VDF-TrFE). One of the electrodes is typically provided closest to the substrate upon which layers of the memory circuit are stacked. The substrate is not shown in the figure. The different layers in the memory circuit are provided as thin-film layers. The thickness of the memory material 2 in case of P(VDF-TrFE) generally is in the range between 20-200 nm. Electrode thicknesses in the case of gold electrodes are advantageously in the interval 30-90 nm.

It shall be remarked that the basic arrangement of Fig 1, with two electrodes embracing a volume of the polarizable memory material to form an elementary memory circuit C, shall also be representative in a more generic fashion of a range of electrode configurations that fall within the realm of the present invention. Examples of the latter include:

Bridged electrodes as disclosed in International published applications No. WO99/08325 or No. WO99/12170.

Lateral geometries, wherein the memory material is provided filling in the gaps between electrodes arranged side by side on a common substrate as disclosed in International published application No. WO03/046995.

Dense metal electrode arrangements as disclosed in International published applications No. WO03/041084 and No. WO03/043013.

As is evident from the above-referred patent documents, the electrodes need not be configured in the parallel-plate capacitor-like sandwich configuration described above, but the same basic principle applies. A memory circuit C is formed by a volume of polarizable material which is under the influence of electric fields set up by two opposing electrodes (which may form a subset of more electrodes contacting the same volume of polarizable material).

In the context of the present invention, this has consequences which prompt the introduction of nomenclature that shall simplify the further presentation. Referring to FIG 1, one notes that in a parallel-plate capacitor ("sandwich") configuration, there are fundamental differences in how the two electrodes are created: First, one electrode 1a is deposited on a substrate. Then, the memory material 2 is deposited onto the electrode 1a. Finally, the electrode 1b is deposited onto the top surface of the memory material 2. The chemical and physical conditions at the interface between the electrode 1a and the memory material 2 are in general entirely different from those relating to the interface between the electrode 1b and the memory material 2. This can be linked to the sequence of operations with associated different procedures and materials involved in creating the memory circuit C. Thus, in the following, references to a so-called "bottom electrode" shall imply that the electrode has been created before application of the layer of memory material 2. Likewise, references to a so-called "top electrode" imply that this electrode has been deposited on top of the memory film 2 which in turn has been deposited in contact with the bottom electrode. While this nomenclature appears intuitive when applied to a parallel-plate capacitor ("sandwich") configuration as shown in FIG. 1, it shall also apply in connection with other electrode configurations as referred above, where the terminology is less intuitive. An example of this is the case of lateral geometries where electrodes are laid out side by side on a substrate, followed by deposition of memory material which fills in the void between the electrodes. In this way, both side-by-side electrodes on the substrate that embrace the memory material to form a memory circuit C are created before deposition of the memory material 2, and shall consequently be defined as "bottom electrodes". As shall become apparent in the subsequent sections, the distinction between bottom and top electrodes becomes useful because of the particular surface treatments, electrode structures and deposition techniques according to the present invention that pertain specifically to either the bottom or the top electrodes.

It is known from prior art that that iodine- modified electrode surfaces, such as iodine-modified gold (IMG) surfaces, induces order in adsorbed organic molecule layers. However, there have been no proposals or experiments regarding the use of iodine-modified electrodes in organic ferroelectric circuits relevant for the present invention, for example as in a circuit as shown in FIG. 1. The crystalline structure of an organic ferroelectric material of the relevant type is directly related to the achievable degree of polarization. At the same time it is a known fact that interface effects make it hard to achieve well-ordered crystalline structures through the whole interface region of the ferroelectric material. If well-ordered crystallites can be arranged in the memory material even in the interface regions, an increase of polarization and thereby improved performance may be expected. According to the present invention the process of depositing and cleaning gold electrode surfaces (as will be accounted for below), comprises etching of the surface. Since many solvents that etch gold or other metals, are based on iodine, an advantageous combination is possible where iodine modification results from an etching step in the manufacturing process. Another possibility is to deposit the memory material together with species comprising iodine atoms.

Moreover, an iodine-modified gold surface that results in an adlayer of iodine protects a clean gold surface from further irreversible contaminations, e.g. during the rest of manufacturing process, something that is highly desirable.

Since the iodine treatment can be made by simple solution treatment, preferably in combination with etching and washing the surface, a iodine modified surface is not increasing complexity to the same extent as interlayers proposed in the prior art.

FIG. 2 shows another embodiment of a memory circuit C with gold electrodes 1a, 1b with an organic electret or ferroelectric material as memory material 2. Materials and thicknesses are essentially the same as presented in conjunction with the embodiment in FIG. 1, but the surface of the bottom electrode 1a has now been modified by iodine resulting in an adlayer 3 of iodine that in FIG. 2 appears as interlayer 3 between the bottom electrode 1a and the memory material 2.

As previously mentioned, special care has to be taken in the manufacturing process to achieve memory circuits with improved performance according to the invention. Generally it is important to avoid contaminations of any interface in physical contact with the memory material, i.e. to assure clean interfaces. This can be particularly hard to achieve for a bottom electrode since the top surface of the bottom electrode will be openly exposed in the process, at least for a period starting after deposition of the electrode material and before the memory material has been deposited. This is typically less of a problem for the top electrode since the electrode material here is deposited directly on the surface of the memory material in one processing step. For the top electrode the main problem instead tend to be connected to via processing of the top electrode, i.e. when there are steps involved that shall etch through the memory material and connect to certain bottom electrodes assigned for via connections. During such via processing there is a substantial risk that the surface of the memory material may be subjected to contaminating species that will damage the memory material and that may cause undesired reactions in the interface between the top electrode and the memory material.

FIG. 3 is a cross section through a top electrode 1b, which has been deposited as two separate layers 11 and 12. A top electrode 1d of this kind could be used in any of the embodiments in FIG. 1 or FIG. 2.

Now the method according to the present invention shall be discussed in detail with reference to FIGS. 4a and 4b which is a flow chart showing the process steps both for realizing the electrode structure of the circuit according to the present invention as well as the circuit itself.

In step 401 a bottom electrode layer of gold (Au) is deposited on an insulating substrate consisting of $SiO_2$. The deposition in step 401 is made by sputtering, although resistive evaporation or electron-beam evaporation is possible alternatives. The thickness of the Au layer is advantageously in the interval 30-90 nm. In a particular embodiment a titanium (Ti) layer with thickness of 5-10 nm is added between the substrate and the Au layer in order to increase adhesion. The bottom electrode 1a is then patterned in step 402 with conventional microphoto lithography followed by wet and dry etching. After the patterning process, the photoresist is stripped off with conventional dry or wet stripping methods. An alternative is to deposit the bottom electrode 1a using moulding means, e.g. to deposit the material using recesses formed in the substrate as accounted for in connection with the discussion related to FIG. 5. Next the surface of the bottom electrode is etched in step 403 by exposing it to a solution that etches the electrode material, here potassium iodine (KI) in a mixture of ethanol and de-ionized water. The concentration of KI should be in the range 0.5-10 mmol/l. Other solutions that are possible include $I_2$ in isopropyl alcohol or potassium iodine in isopropyl alcohol. It is considered advantageous to use solutions comprising iodine atoms because of iodine modification effects, as for example in the case of iodine-modified gold. A preferred technique is to use dipping of the wafers in the solution for a predetermined time period that can be up to approximately a minute, followed by washing in water, dipping in isopropanol, spin-rinsing in de-ionized water and drying in $N_2$. Alternative methods include spin coating or spraying. Next a layer of organic electret or ferroelectric material is deposited in step 404; here in the form of a polymer layer 2 of P(VDF-TrFE) that is globally spin-coated on the wafer. The thickness is typically selected in the interval 20 nm to 200 nm. The deposited polymer is then annealed, typically on a hot plate or in a convection oven.

Now the top electrode 12 shall be deposited in steps 405-409. It is not always required that it shall be made of gold. A first example of a case where the top electrode 1b is made of gold shall now be provided, where a connection from the top electrode through the layer of organic active material, for instance a ferroelectric polymer, is required. The latter circumstance is nearly always topical in matrix-addressable ferroelectric memories where via connections of metal shall be formed in the global thin film of memory material in order to obtain a connection with e.g. circuitry for driving, control and error correction provided in the substrate and usually realized in CMOS technology, as will be the case with so-called hybrid polymer memory chips, wherein apart from the matrix-addressable memory itself, all other circuits are realized in inorganic material, e.g. in silicon, due to speed, power and integration requirements.

The gold layer 11 is deposited in step 405, for instance by physical vapourdeposition (PVD), to a thickness of 30 to 90 nm. The gold layer 11 mayconstitute a single-layer electrode and is as such processed further in steps 407, 408, the processing including patterning and etching in step 407 andetching and washing in step 408. The top electrode 1b can as alreadymentioned in connection with FIG. 3, be a two-layer electrode and gold may thenbe used as a first layer 11 thereof. A decision to deposit a second electrodelayer is made in step 406. By resorting to gold as at least one of the electrodemetals of the top electrode ib, using a two-layer process, a first electrode layer 11 of gold is deposited on the top of the polymer layer 2 in step 405. In step 408 the second layer 12 of gold or another well-conducting electrode material isdeposited on top of the first gold layer 11 and the first and second layerstogether constitute the top electrode 1b. The minimum thickness of the secondlayer 12 depends on thickness of the first layer 11 and on the depositiontechnique, e.g., in the case of PVD it is dependent on the degree of stepcoverage. The top electrode is finally patterned in step 410 using conventional micro photolithography followed by wet etching and a final etching and washingstep 411. The photoresist is stripped off with dry or wet stripping methods. It should be noted that in case of dry stripping, parts of the organic memory material that is not protected by the top electrode will also be stripped off.

An alternative to the last steps 410 and 411 a thin layer of titanium could be deposited for use as a hard mask in the top electrode etching process. The titanium layer is patterned with conventional microphotolithography followed by wet or dry etching. The photo resist is then stripped off with dry or wet stripping methods.

The electronic circuit C according to the invention as shown for instance in FIG. 1 or FIG. 2 could be stacked in a vertical array to form a column of a number n of such circuits. In this case the top electrode 1b in a circuit $C_k$ becomes the bottom electrode in the succeeding circuit $C_{k+1}$ in the stack and so on. In such cases the active material 2 may be deposited directly on the top electrode and according to the invention then also be made of gold and subjected to the same chemical treatment as the bottom electrode in any case.

In this connection there can once more be referred to the flow diagram in FIGS. 4a and 4b. In step 412 a decision is made as to the stacking of memory circuits of the invention, by returning to step 404 and repeating this and succeeding steps 405-408 or 405, 406 and 409-411

The advantage of stacking circuits according to the invention in this manner can be exemplified by a first referring to an arrangement shown in FIG. 6a, which for instance shall be taken to be a ferroelectric data storage apparatus comprising of a number of stacked memory devices $M_1$-$M_4$. Each memory device shows a matrix-addressable array of the memory cells C and are surrounded by electrode layers 16a, 16b provided on respective either side of the active material 2, i.e. in this case the memory material. The memory devices stacked in this manner can form a volumetric memory device provided on a substrate S and insulating layer 15 has been formed in the top of the substrate S adjacent to the first electrode layer 16a comprising the bit line electrodes of the matrix-addressable memory devices $M_1$. The word line electrodes are provided in electrode layers 16b adjacent to the memory material 2 on the opposite side of the global layer of memory material 2. A separation layer 17 then follows covering the electrode layer 16b and usually provided with a planarizing and in general insulating function. The first electrode layer 16a of the following memory device $M_2$ now follows in a similar manner surrounded by electrode layers 16a and 15b forming respectively the bit line electrodes and the word line electrodes of the matrix-addressable memory device.

In other words there will be two electrode layers 16a, 16b for each memory device M and in addition each memory device must be separated by the separation layer 17. This implies that now each memory device M can be addressed completely independent on any other device such that in practice a parallel addressing of each memory device in the volumetric apparatus shown in FIG. 8a can take place.

Figure 8A:
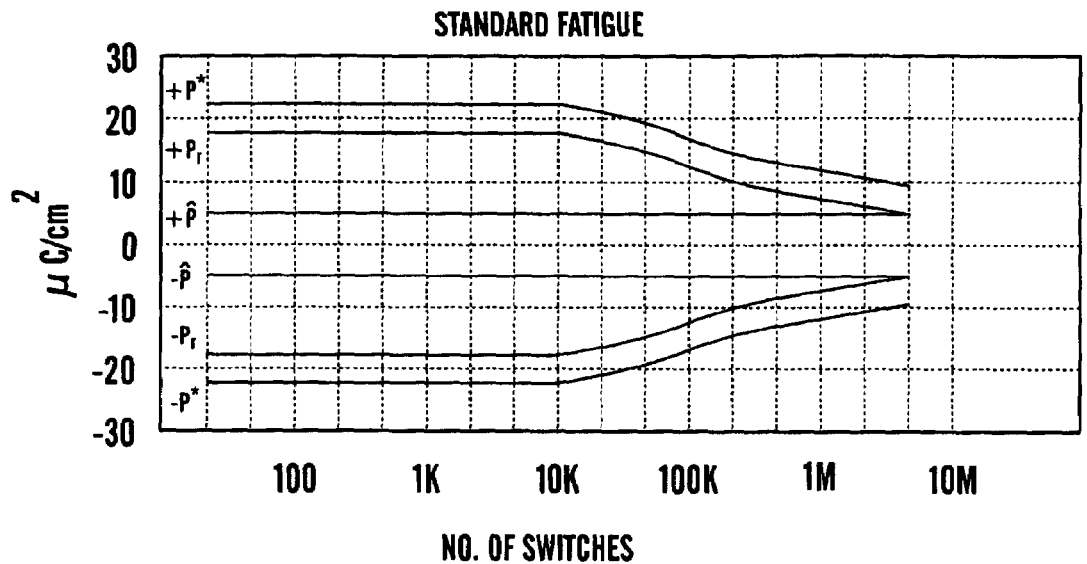

According to the present invention, when gold electrodes are used at least in the bottom electrode layer, i.e. in FIG. 8a the electrode layers 16a, the exposed surface of all electrodes 16a can be chemically treated before the memory material 2 is deposited over this electrode surface.

In order to reduce the number of electrode layers and insulating layers a more simplified volumetric apparatus for data storage was proposed in the late 1980-ies. Here the memory devices M are provided in a stack on a substrate S comprising an insulating surface layer 15. Now follows the bottom electrode layer 16a of the first memory device $M_1$ and according to the invention the gold can be appropriately chemically treated before the memory material 2 is provided on the top of this electrode. The next electrode layer, the top electrode layer 16b, the memory device $M_1$ is also provided as the bottom electrode layer 16a of the succeeding memory layer $M_2$ and so on. In other words, the top electrode layer of a memory device always becomes the bottom electrode layer of a succeeding memory device and hence the electrode layers from the second to the second last in the stack alternatively takes the role of bit lines and word lines depending on which of the memory devices M that shall be addressed. At the same time, of course the shared electrode layers made of gold must be appropriately processed before the provision of the memory material over the top thereof.

Obviously a stacked data storage apparatus of this kind shall require via connections from any memory device in the stack down to circuitry located in the substrate and via connections can now advantageously of course be made in the manner discussed hereinabove. This of course implies that the top electrodes of each memory device in the volumetric data storage apparatus preferably can be provided as two-layered gold electrodes and that appropriate via connections are formed by the second gold layer through via openings, which have been etched through the first gold layer and the active material or memory material 2. Since the top electrodes of each memory device from the second memory device in the stack also forms the bottom electrodes of a succeeding memory device in the stack, the second layer of gold in these electrodes must be appropriately treated before the active material 2 is provided thereon. In the volumetric data storage apparatus in FIG. 6b, obviously two adjacent memory devices cannot be addressed simultaneously since the word lines in the first one are the bit lines in the following one and so on. This disadvantage is of course somewhat alleviated by the fact that still every second memory device in the stack can be addressed in parallel and that the number of electrode layers in this case is not $2n$ as in FIG. 6a, but instead are reduced to $n+1$, while the separation layers are no longer required. It could also be noted that attempt to provide a volumetric data storage apparatus with the capability of simultaneous and parallel addressing of all memory devices or memory planes can result in layout problems as it will require a number of sense amplifiers that would stand in a linear relation to the number of memory devices in the stack.

FIG. 7a shows a sample of a gold electrode made according to the prior art. As can be seen the surface of this prior art gold electrode is littered with bubbles. Now can this sample be compared with a gold electrode as shown in the microphotography of FIG. 7b and made according to the present invention. It presents an absolute smooth surface as obtainable with the chemical modification according to the present invention and it is quite evident that any contact problems that may occur with prior art now is wholly eliminated. Apart from the morphological improvement, the chemically modified gold electrode according to the present invention also entails other advantages.

Figure 8B:
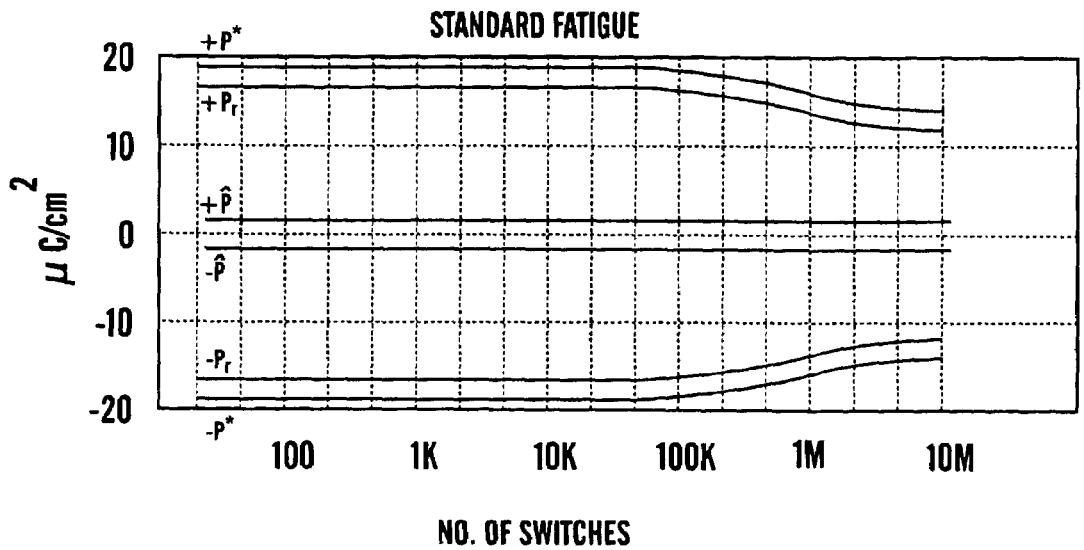

To further emphasize the somewhat unexpected good results that may follow by using gold as electrode material according to the present invention, FIGS. 8a-8d illustrates the performance of a memory circuit according to the present invention and a memory circuit according to prior art. FIGS. 8a and 8b show respectively the fatigue behaviour of a prior art memory circuit and an inventive memory circuit. The curves are shown for various significant parameters of a ferroelectric material hysteresis loop and given as a function of the number of switchings, i.e. polarization reversals. The parameters included as rendered are the remanent polarization $P_r$, the saturation polarization $P^*$ and the non-switching polarization $\hat{P}$ which is the difference between the latter and the former. The curves are given both for the positive and negative polarization states. A comparison of the diagrams shows a significant improvement with the use of gold electrodes according to the present invention. While there is an appreciable drop in the remanent polarization between $10^5$ and $10^6$ switches in FIG. 2a, the remanent polarization in FIG. 8b remains high beyond $10^7$ switches. It appears that the present invention offers ferroelectric memory circuits capable of yielding good detection discrimination well beyond $10^7$ switches, in other words, an improvement in the fatigue resistance of at least three orders of magnitude.

Figure 8C:
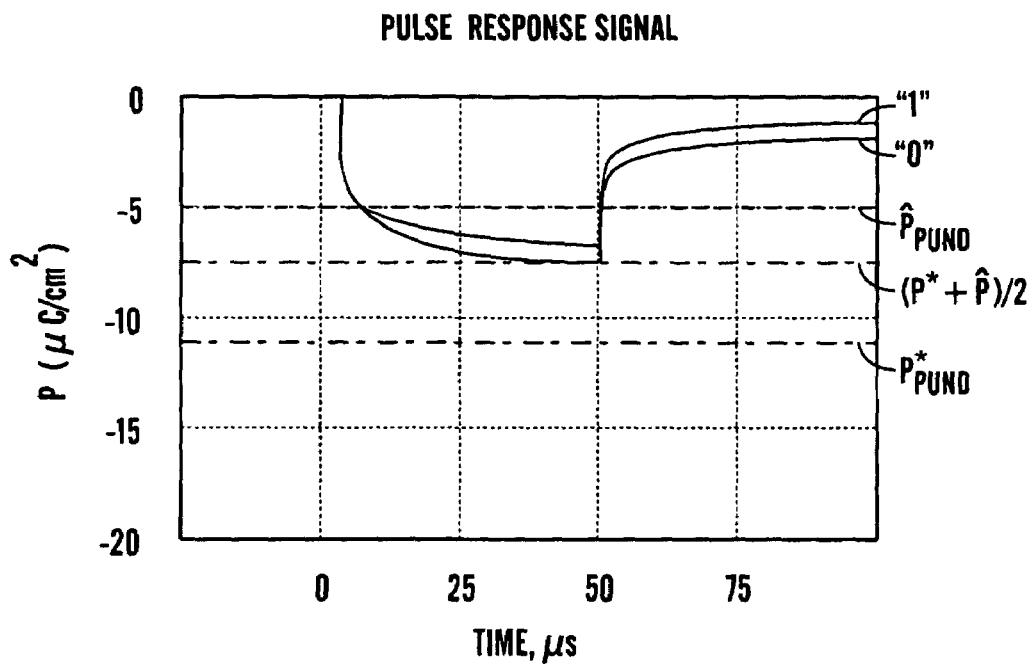
Figure 8D:
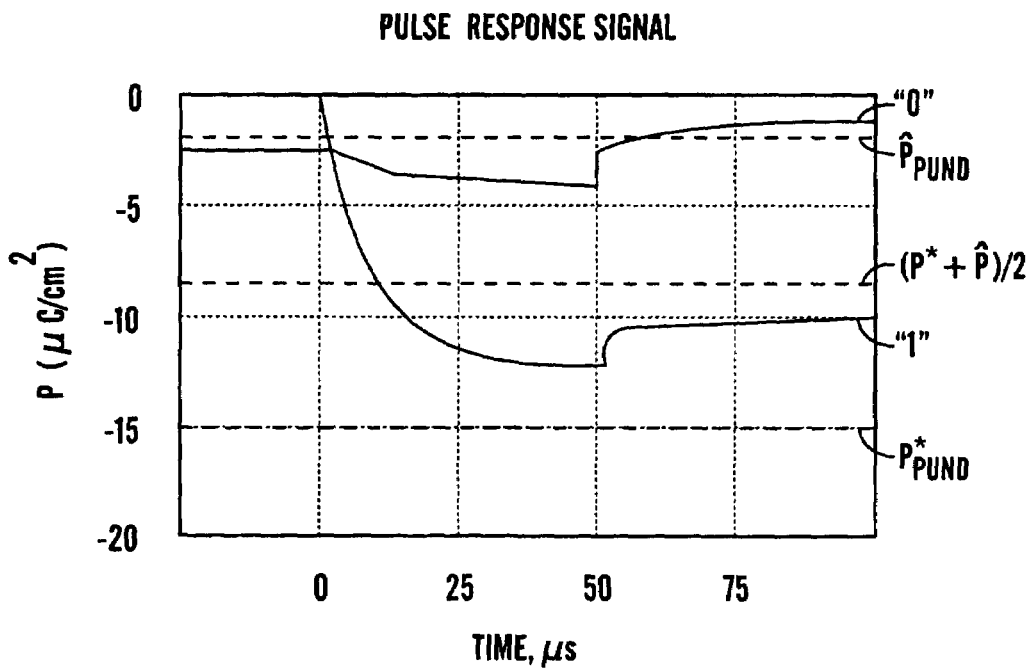

Also the detrimental effects of disturb voltage pulses can be significantly alleviated. When a memory cell is switched in an addressing operation in a passive matrix-addressable memory where all memory cells permanently contact addressing electrodes, non-addressed or unselected memory cells are subjected to disturb voltages, sneak currents and stray capacitances. The effect is that unselected memory cells or unaddressed memory cells may be partially or wholly depolarized depending on the initial polarization state. After being subjected to a large number of disturb pulses all the memory cells of a passive matrix-addressable memory could easily end up with the same polarization state and a discrimination between say an originally stored logical 0 and a logical 1 in a readout operation shall no longer be possible. FIG. 8c shows the situation after subjecting a prior art memory cell to a realistic number of disturb pulses. It is hardly possible to discriminate between the pulses. With the present invention, however, the situation becomes radically different as seen from FIG. 8d. Here the output response signals are essentially unaffected and the original excellent discrimination retained.

Embodiments and examples have been presented hereinabove in order to provide concreteness to the invention and make it applicable to persons skilled in the art. It is not intended that specific references shall be considered as limitations of the scope of the invention, except from what is set forth in the accompanying claims.

The invention claimed is:

1. An organic electronic circuit, comprising:
    an organic ferroelectric or organic electret active material,
    wherein the organic active material comprises fluorine atoms and includes single molecules, oligomers, homopolymers, copolymers, or blends or compounds thereof,
    wherein the organic active material is in direct contact with both a first electrode and a second electrode, whereby a cell with a capacitor-like structure is defined in the organic active material and can be accessed electrically directly or indirectly via the electrodes; and
    wherein at least one of the electrodes comprises at least one layer of gold chemically modified by iodine, the iodine being at least provided in or at a gold layer surface interfacing the organic active material.

2. An organic electronic circuit, comprising:
    an organic ferroelectric or organic electret active material,
    wherein the organic active material comprises fluorine atoms and includes single molecules, oligomers, homopolymers, copolymers, or blends or compounds thereof,
    wherein the organic active material is in direct contact with both a first electrode and a second electrode, whereby a cell with a capacitor-like structure is defined in the organic active material and can be accessed electrically directly or indirectly via the electrodes; and
    wherein at least one of the electrodes comprises at least one layer of gold chemically modified by iodine such that an adlayer of iodine atoms forms between the organic active material and the at least one layer of gold, the iodine adlayer directly interfacing with the at least one gold layer surface and also with the organic active material.

3. An organic electronic circuit according to claim 1, wherein the first electrode, the organic ferroelectric or organic electret active material and the second electrode are provided in that order of sequence, said first electrode and said second electrode being termed the bottom electrode and the top electrode, respectively.

4. An organic electronic circuit according to claim 3, wherein the at least one electrode is the bottom electrode.

5. An organic electronic circuit according to claim 3, wherein the top electrode consists of first and second layers of gold deposited in respective separate steps.

6. An organic electronic circuit according to claim 1, wherein the organic active material comprises vinylidene fluoride (VDF) in oligomer, homopolymer or copolymer form.

7. An organic electronic circuit according to claim 6, wherein the vinylidene fluoride copolymer is polyvinylidene fluoride trifluoroethylene P(VDF-TrFE).

8. An organic electronic circuit according to claim 1, wherein the circuit forms a layer in a stack of n such circuits $C_1 \ldots C_n$ such that the bottom electrodes 1a of circuit $C_k$ forms the top electrode of a preceding circuit $C_{k-1}$, where $2 \leq k \leq n$.

9. An organic electronic circuit according to claim 1, wherein the circuit forms
    an element or a cell in a passive matrix-addressable array of a plurality of such circuits,
    the matrix-addressable array particularly being a ferroelectric or organic electret memory device comprising organic memory cells, that the memory cells are provided as distinct portions in a global thin-film layer of an organic ferroelectric or electret active material, that first and second electrode means are provided as respective sets of parallel strip-like electrodes that the electrodes of the second electrode means are oriented crossing at an angle to the electrodes of the first electrode means, that the organic global thin-film layer of active material is sandwiched between the electrode means, that the memory cells of the memory circuits are defined in the thin-film layer at the crossings of respectively the electrodes (1a) of the first electrode means and the electrodes of the second electrode means, and that an array of memory circuits is formed by the electrode means and the global layer of active material, whereby the addressing of the memory cells for write and read operations thereto can take place via the electrodes suitably connected with external circuitry for drive, control and detection.

10. A passive matrix-addressable electronic device according to claim 9, wherein the electrodes of the first electrode means constitutes the bottom electrodes of the cells of the passive matrix-addressable array.

* * * * *